(12) United States Patent
Chen et al.

(10) Patent No.: US 10,714,483 B2
(45) Date of Patent: Jul. 14, 2020

(54) MEMORY DEVICES AND METHODS FOR FABRICATING THE SAME

(71) Applicant: Winbond Electronics Corp., Taichung (TW)

(72) Inventors: Huang-Nan Chen, Taichung (TW); Noriaki Ikeda, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 1 day.

(21) Appl. No.: 16/183,143

(22) Filed: Nov. 7, 2018

(65) Prior Publication Data

US 2019/0319029 A1 Oct. 17, 2019

(30) Foreign Application Priority Data

Apr. 16, 2018 (TW) .............................. 107112891 A

(51) Int. Cl.
*H01L 27/108* (2006.01)

(52) U.S. Cl.
CPC .. *H01L 27/10855* (2013.01); *H01L 27/10814* (2013.01); *H01L 27/10817* (2013.01); *H01L 27/10823* (2013.01)

(58) Field of Classification Search
CPC ......... H01L 27/10814; H01L 27/10817; H01L 27/10823; H01L 27/10855
See application file for complete search history.

(56) References Cited

U.S. PATENT DOCUMENTS

| | | | |
|---|---|---|---|
| 6,143,648 A | 11/2000 | Rodriguez et al. |
| 6,835,649 B2 | 12/2004 | Lee et al. |
| 7,902,059 B2 | 3/2011 | Kim et al. |
| 2003/0033579 A1 | 2/2003 | Wu et al. |
| 2005/0136631 A1 | 6/2005 | Jaiprakash et al. |
| 2010/0181672 A1 | 7/2010 | Hwang |
| 2014/0035050 A1 | 2/2014 | Lim et al. |
| 2016/0300885 A1 | 10/2016 | Konevecki et al. |
| 2017/0213833 A1 | 7/2017 | Godo et al. |

*Primary Examiner* — Samuel A Gebremariam
(74) *Attorney, Agent, or Firm* — Muncy, Geissler, Olds & Lowe, P.C.

(57) ABSTRACT

Memory devices include a first dielectric layer disposed on a substrate. Memory devices include a pair of contacts and a dielectric portion disposed in an opening of the first dielectric layer. The pair of contacts are separated from each other by the dielectric portion. Each contact includes a first conductive portion disposed on the substrate, a second conductive portion disposed over the first conductive portion and a lining layer disposed between the first conductive portion and the second conductive portion and on a sidewall of the opening. The second conductive portion has a sidewall that is in contact with the dielectric portion and the lining layer is not located thereon. The second conductive portion has a corner in connection with the sidewall and a top surface of the second conductive portion, and a protection portion is disposed on the corner.

5 Claims, 18 Drawing Sheets

MEMORY DEVICES AND METHODS FOR FABRICATING THE SAME

CROSS REFERENCE TO RELATED APPLICATIONS

This application claims the benefit of Taiwan Patent Application No. 107112891 filed on Apr. 16, 2018, entitled "MEMORY DEVICES AND METHODS FOR FABRICATING THE SAME" which is hereby incorporated herein by reference.

BACKGROUND

Field of the Disclosure

The present disclosure relates to a memory device, and in particular, it relates to a contact in a memory device and a method of forming the same.

Description of the Related Art

Dynamic Random Access Memory (DRAM) devices are widely used in consumer electronic products, such as personal computers, smartphones or tablet computers. Generally, the steps for fabricating a DRAM device include forming a metal oxide semiconductor (MOS) transistors and contacts on a substrate, and subsequently forming capacitors on the contacts, wherein the capacitors are in electrical connection with the substrate and the MOS transistors through the contacts.

In order to increase element density in a DRAM device and improve its overall performance, the existing technologies for fabricating DRAM devices continue to focus on scaling down the size of the elements. However, in scaling down the size of the minimum elements, such as contacts, new challenges arise. For example, a defect such as a void may be formed when filling a trench with a material layer, which results in reducing the reliability of a DRAM device. Therefore, there is a need in the industry to improve the method for fabricating DRAM devices to overcome problems caused by scaling down the size of elements.

SUMMARY

In some embodiments of the disclosure, a method for fabricating a memory device is provided, including: forming an isolation region in a substrate to define active regions that are arranged in a first direction; forming pairs of word lines in the substrate, wherein each of the active regions corresponds to one of the pairs of word lines, and each of the active regions has a drain region between one word line of the pairs of word lines and the isolation region and a source region between one of the pairs of word lines; forming a first dielectric layer on the substrate to cover the pairs of word lines, wherein the first dielectric layer has a first opening exposing the isolation region and the drains of neighboring two of the active regions; filling a lower portion of the first opening with a first conductive material layer; conformally forming a lining layer over sidewalls of an upper portion of the first opening and a top surface of the first conductive material layer; filling the upper portion of the first opening with a second conductive material layer after forming the lining layer; performing an etch-back process on the second conductive material layer and the lining layer in the first opening to form a recess; conformally forming a protection layer on sidewalls and a bottom portion of the recess and a top surface of the first dielectric layer; performing an etching process to form a second opening that penetrates through the protection layer, the second conductive material layer, the lining layer and the first conductive material layer and exposes the isolation layer; forming a second dielectric layer that covers the protection layer and the first dielectric layer and entirely fills the second opening; and removing portions of the first dielectric layer, the protection layer and the second dielectric layer so that a top surface of the second conductive material layer, a top surface of the first dielectric layer and a top surface of the second dielectric layer in the second opening are coplanar.

In some embodiments of the disclosure, a memory device is provided, including: a substrate; an isolation region and active regions disposed in the substrate; pairs of word lines disposed in the substrate, wherein each of the active regions corresponds to one of the pairs of word lines, and each of the active regions has a drain region between one word line of the pairs of word lines and the isolation region and a source region between one of the pairs of word lines; a first dielectric layer disposed on the substrate and covering the pairs of word lines, wherein the first dielectric layer has an opening exposing the isolation layer and the drains of neighboring two of the active regions; and a pair of contacts and a dielectric portion disposed in the opening, wherein the pair of contacts are separated from each other by the dielectric portion, wherein each contact comprises a first conductive portion disposed on the substrate, a second conductive portion disposed over the first conductive portion and a lining layer disposed between the first conductive portion and the second conductive portion and on a sidewall of the opening, wherein the second conductive portion has a sidewall that is in contact with the dielectric portion and the lining layer is not located thereon, and wherein the second conductive portion has a corner in connection with the sidewall and a top surface of the second conductive portion, and a protection portion is disposed on the corner.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn in different scales for the sake of simplicity and clarity. Throughout the various views and illustrative embodiments, like reference numbers are used to designate like elements.

Figure 1:
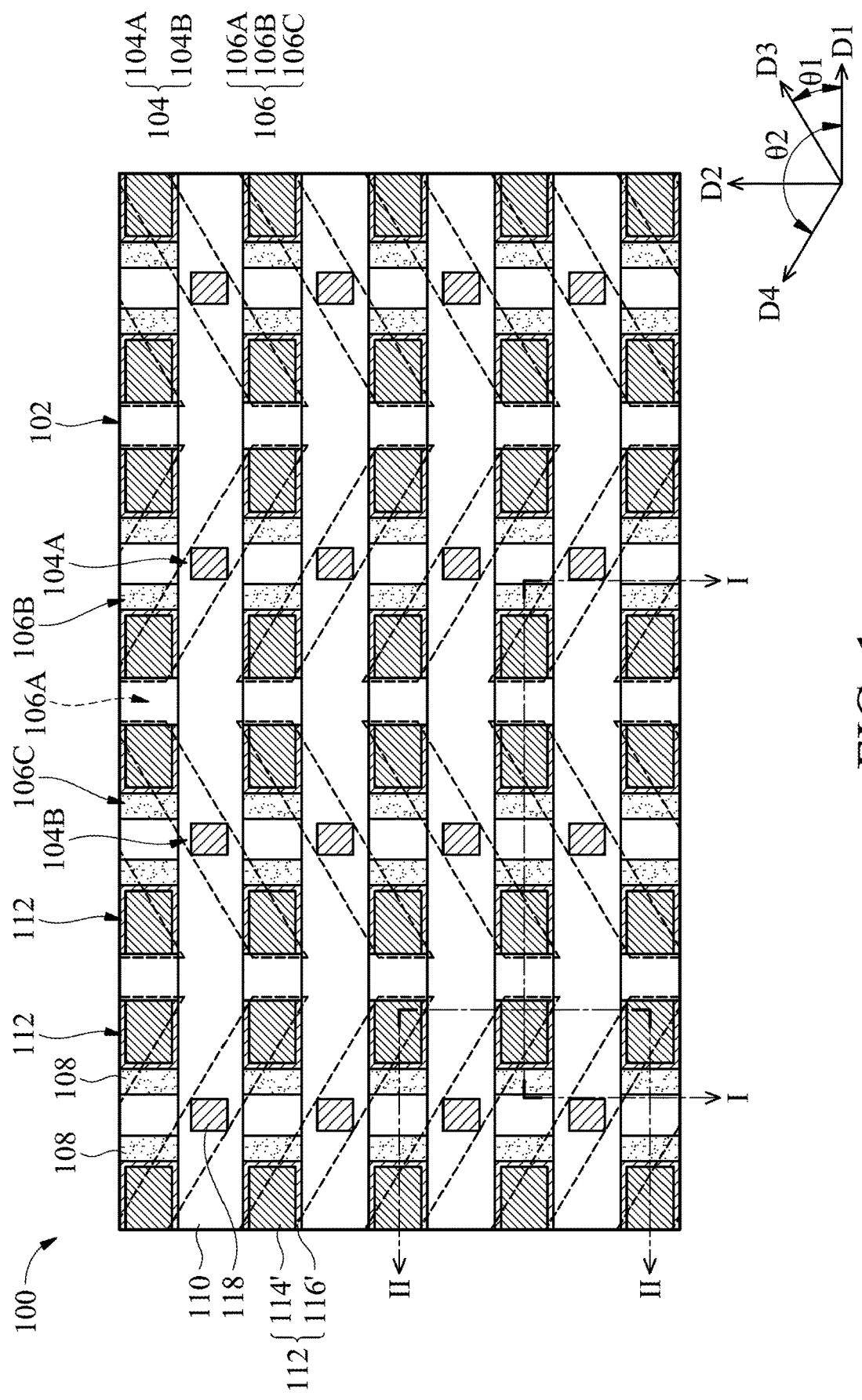
FIG. 1 is a top view of a memory device in accordance with some embodiments of the present disclosure.

FIG. 1 is a top view of a memory device 100 in accordance with some embodiments of the present disclosure. The memory device 100 includes a substrate 102, active regions 104, an isolation region 106, word lines 108, bit lines 110, contacts 112 and bit line contacts 118. The active regions 104 include active regions 104A and active regions 104B. The contact 112 includes a first conductive portion 136' (not shown), a silicide layer 138' (not shown), a lining layer 116' and a second conductive portion 114'. For the sake of simplicity and clarity, FIG. 1 only shows the above features, and remaining features are shown in cross-sectional views of FIG. 3 or 5, which are taken along line I-I in FIG. 1.

Referring to FIG. 1, the isolation region 106 is formed in the substrate 100 and includes isolation regions 106A, isolation regions 106B and isolation regions 106C. The isolation regions 106A extend along a direction D2 and are arranged in a direction D1. The isolation regions 106B extend along a direction D4 and the isolation regions 106C extend along a direction D3. The isolation regions 106B and 106C are each arranged in the direction D2, and the isolation regions 106B and 106C are alternately arranged in the direction D1.

The direction D1 is substantially perpendicular to the direction D2, the direction D1 intersects the direction D3 at an acute angle θ1, and the direction D1 intersects the direction D4 at an obtuse angle θ2.

The active regions 104 in the substrate 102 are defined by the isolation region 106. Specifically, one active region 104A is defined by two isolation region 106A and two isolation region 106B, and one active region 104B is defined by two isolation region 106A and two isolation region 106C.

The bit lines 110 are formed over the substrate 102 and extend along the direction D1. The bit lines 110 are arranged corresponding to the active regions 104. The word lines 108 are formed in the substrate 102 and extend along the direction D2. The word lines 108 are arranged in the direction D1 in a way that one pair of the word lines 108 corresponds to one active region 104A or one active region 104B.

In some embodiments, the bit line contact 118 is located where the active region 104 overlaps the bit line 110. When a bit line 110 over the substrate 102 is cross a pair of neighboring word lines 108, the bit line 110 is in electric connection with a source region (not shown) through a bit line contact 118. The source region is disposed in the active region 104 and substantially disposed between opposite inner sides of the pair of neighboring word lines 108.

Figure 5:
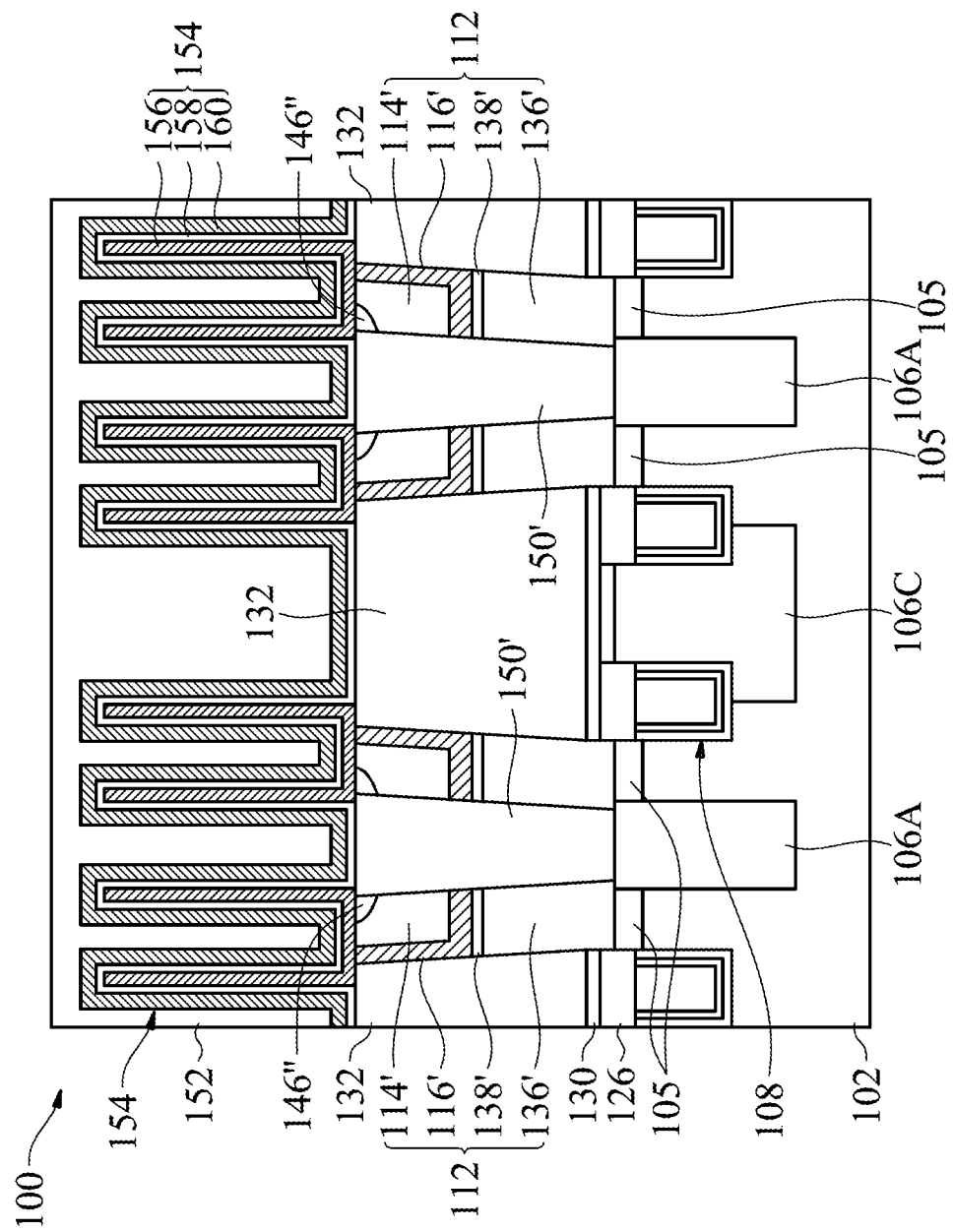
FIG. 5 is a cross-sectional view of the memory device in accordance with the second embodiment of the present disclosure.

Referring to FIG. 1 and FIG. 5 (or FIG. 3), two contacts 112 are disposed on each of the active regions 104. The contacts 112 are correspondingly disposed on two drains 105 of the active region 104. The two drain regions 105 are in the active region 104 and substantially disposed between opposite outer sides of the pair of neighboring word lines 108 and the isolation regions 106A. The contact 112 includes a first conductive portion 136', a silicide layer 138', a lining layer 116' and a second conductive portion 114'. As shown in FIG. 1, the lining layer 116' surrounds three sidewalls of the second conductive portion 114' with a lying "U" shape, and the lining layer 116' is not formed on a sidewall of the second conductive portion 114' which faces to the isolation region 106A.

FIGS. 2A-2E and 2E' and FIGS. 4A-4H and 4H' illustrate cross-sectional views at various stages of forming a memory device 100 in accordance with different embodiments of the present disclosure, wherein left part of each figure is a cross-sectional view taken along line I-I in FIG. 1, while right part of each figure is a cross-sectional view taken along line II-II in FIG. 1.

Figure 2A:
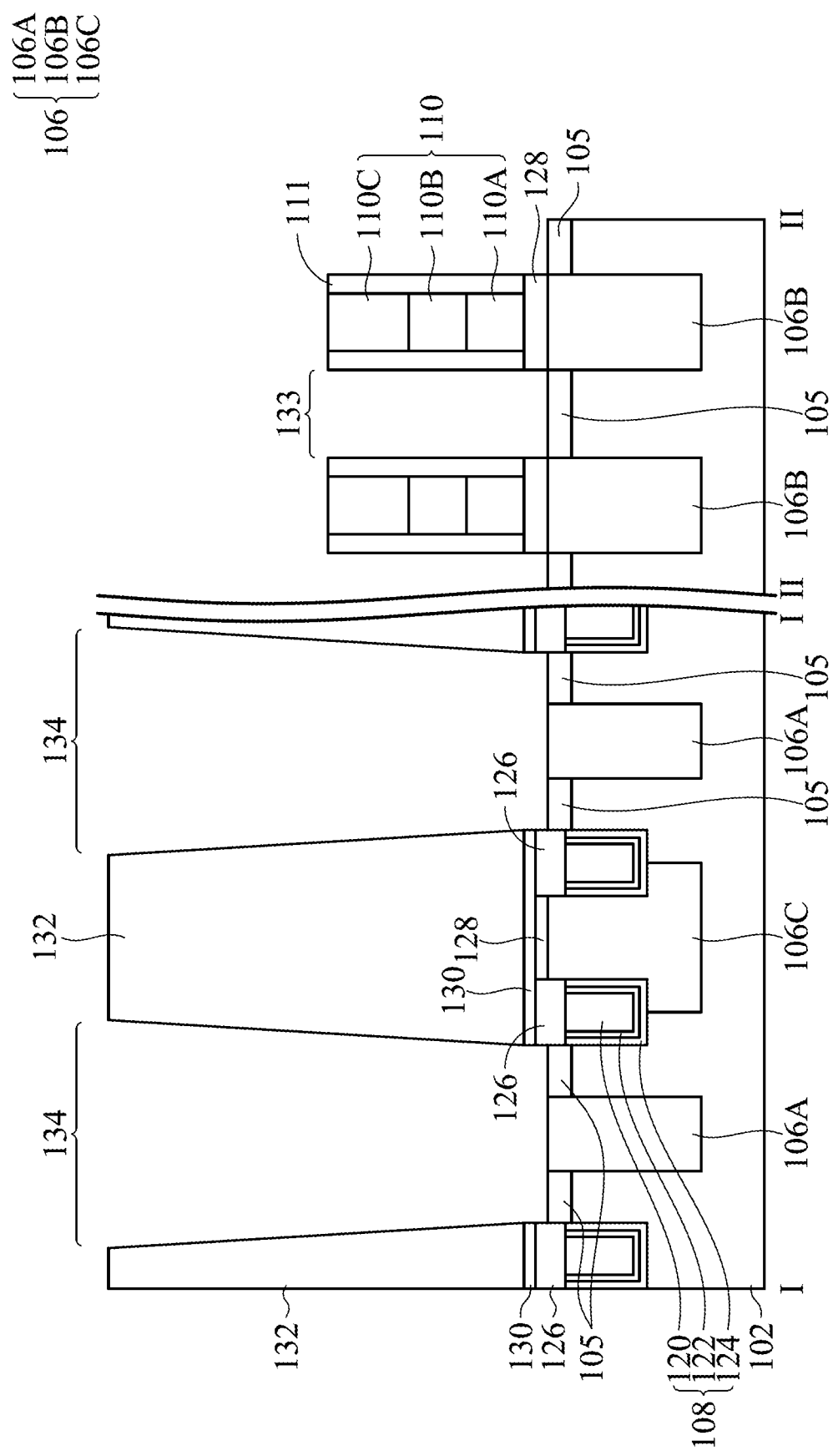
FIGS. 2A-2E and 2E' illustrate cross-sectional views at various stages of forming a memory device in accordance with a first embodiment of the present disclosure.

Referring to FIGS. 1, 2A-2E and 2E' and 3, the first embodiment of the present disclosure is illustrated below. Referring to FIG. 2A, a substrate 102 is provided. In some embodiments, the substrate 102 may be an elemental semiconductor substrate, such as a silicon substrate or a germanium substrate; a compound semiconductor substrate, such as a silicon carbide substrate or a gallium arsenide substrate; a semiconductor-on-insulator (SOI) substrate, or the like.

Next, an isolation region 106 is formed in the substrate 102 to define active regions 104 in the substrate 102. In some embodiments, the material of the isolation region 106 may be an insulating material, such as silicon oxide, silicon nitride, silicon oxynitride, or the like. The isolation region 106 may be formed by an etching process and a deposition process.

Next, word lines 108 are formed in the substrate 102. As shown in FIG. 2A, a pair of neighbor word lines 108 is disposed between two isolation regions 106A. The word line 108 includes a gate electrode 120, a gate lining layer 122 and a gate dielectric layer 124. The gate dielectric layer 124 surrounds the gate electrode 120 to electrically isolate the gate electrode 120 from the substrate 102. The material of the gate electrode 120 may be a conductive material, such as amorphous silicon, polysilicon, metal, metal nitride, conductive metal oxide, or the like. The material of the gate lining layer 122 may be a conductive material, such as tungsten nitride (WN), titanium nitride (TiN), tantalum nitride (TaN), or the like. The material of the gate dielectric layer 124 may be silicon oxide, silicon nitride, silicon oxynitride, high-k dielectric material, or the like.

Next, an insulating layer 126 is formed over the word line 108. An insulating layer 128 is formed between the insulating layers 126 which are disposed over a pair of word lines 108 on opposite sides of the isolation region 106C. An insulating layer 130 is formed over the insulating layer 126 and insulating layer 128. In some embodiments, the material of the insulating layer 126 may be silicon nitride, the material of the insulating layer 128 may be a silicon oxide, and the material of the insulating layer may be silicon nitride.

Next, a bit line contact opening (not shown) which extends along the direction D2 is formed between the pair of word lines 108 to expose a source region (not shown) between the pair of word lines 108. Thereafter, a bit line 110 is formed over the substrate 102, and an insulating layer 111 is formed on sidewalls of the bit line 110. In some embodiments, the bit line 110 may include a conductive layer 110A, a conductive layer 110B and a mask layer 110C, wherein the conductive layer 110A of the word line 110 has a portion that fills the bit line contact opening (not shown), and the portion of the conductive layer 110A acts as the bit line contact 118 shown in FIG. 1 to be electrically connected to the source region (not shown).

Next, a dielectric layer 132 is formed over the substrate 102, and an opening 134 which extends along the direction D2 is formed in the dielectric layer 132. The opening 134 exposes a top surface of the isolation region 106A and the respective drain regions 105 of two neighboring active regions 104A and 104B with respect to opposite sides of the isolation 106A. A bottom portion of the opening 134 may laterally extend to the insulating layer 126. The material of the dielectric layer 132 may be silicon oxide, silicon nitride, silicon oxynitride, a combination thereof, or the like. In some embodiments, the dielectric layer 132 may be a multilayered dielectric material layer (not shown). For example, a lower portion of the dielectric layer 132 may be a spin-on dielectric (SOD) material, and an upper portion of the dielectric layer 132 may be a tetraethoxysilane (TEOS) material. In some embodiments, the dielectric layer 132 may be formed by a deposition process, and then the opening 134 may be etched in the dielectric layer 132. As shown in FIG. 2A, an opening 133 is formed between two neighboring bit lines while the opening 134 is formed.

Figure 2B:
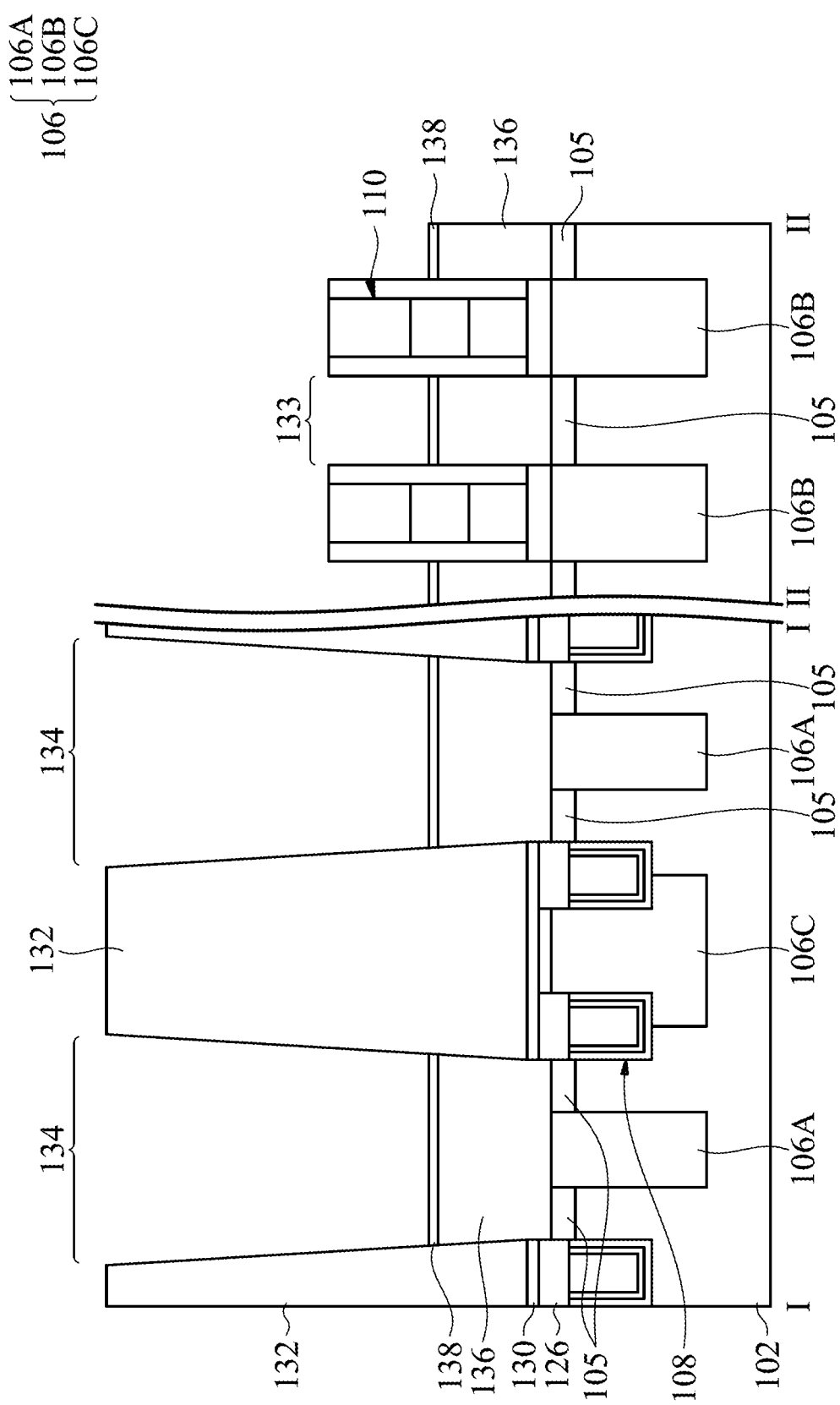

Referring to FIG. 2B, a first conductive material layer 136 is formed on a lower portion of the opening 134. In some embodiments, the first conductive material layer 136 may be a semiconductor material, such as a doped or a non-doped polysilicon, or a metal material, such as copper (Cu), aluminum (Al), tungsten (W), or a combination thereof. In some embodiments, the first conductive material layer 136 may be formed by a deposition process and an etch-back process.

In an embodiment in which the first conductive material 136 includes polysilicon, a silicide layer 138 may be formed on the top surface of the first conductive material layer 136.

Figure 2C:
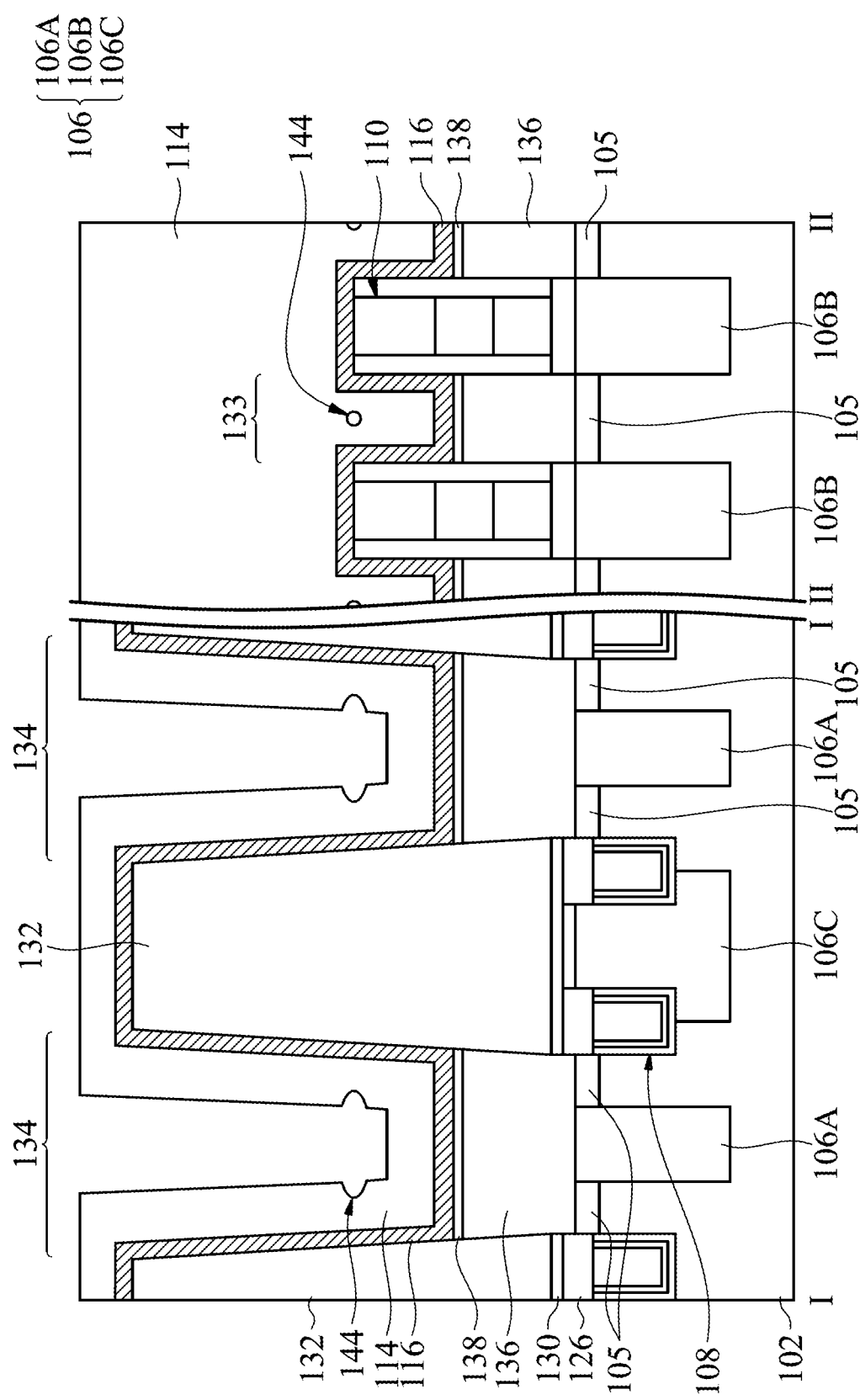

Referring to FIG. 2C, a lining layer 116 is conformally formed on the substrate 102, and a second conductive material layer 114 is conformally formed on the lining layer 116. In this embodiment, the lining layer 116 and the second conductive material layer 114 each have vertical portions formed on sidewalls of the upper portion of the opening 134 and horizontal portions formed on a bottom portion of the upper portion of the opening 134 and the dielectric layer 132. The material of the lining layer 116 may be titanium nitride (TiN), tantalum nitride (TaN), tungsten nitride (WN), a combination thereof, or the like. The second conductive material layer 114 may be a metal material, such tungsten (W), copper (Cu), aluminum (Al), gold (Au), chromium (Cr), nickel (Ni), platinum (Pt), titanium (Ti) or a combination thereof.

Figure 2D:
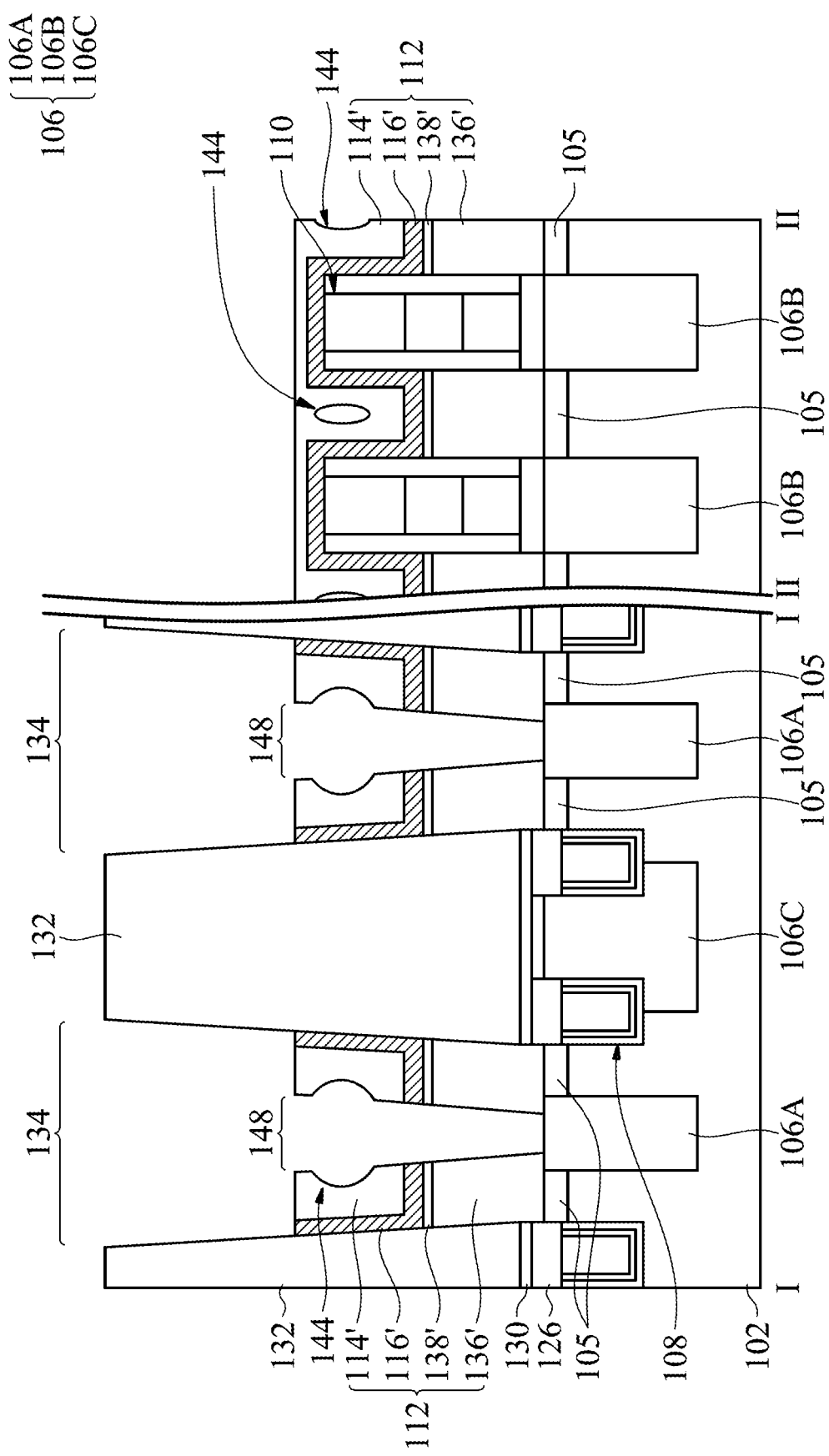

It should be noted that as scaling down the size of the memory device, a void may be created within the conductive material in a contact opening while the contact opening is filled with the conductive material to form a contact. For example, referring to FIGS. 1 and 2C simultaneously, since the dimension of the opening 133 between the bit lines in the direction D2 is narrow, a void 144 is easily formed within the second conductive material layer 114 in the opening 133 when filling the opening 133 with the second conductive material layer 114. During the subsequent etching process performed on the second conductive material layer 114, a portion of the second conductive material layer 114 adjacent to the void 144 may be further etched resulting in enlarging the void 144 (as shown in FIG. 2D). This, in turn, reduces the contact area between the contact 112 and the capacitor subsequently formed resulting in increasing the contact resistance.

Referring to FIG. 2D, an etch-back process is then performed on the second conductive material layer 114 to remove the horizontal portions of the second conductive material layer 114. Portions of the lining layer 116, the silicide layer 138 and the first conductive material layer 136 which are uncovered by the vertical portions of the second conductive material layer 114 are removed by using the vertical portions of the second conductive material layer 114 as an etching mask. An opening 148 penetrates through the second conductive material layer 114, the lining layer 116, the silicide layer 138 and the first conductive material layer 136 until the top surface of the isolation region 106A is exposed. In some embodiments, the etching process for forming the opening 148 may be multiple etching steps that use different etching formula for respective material layers. In some other embodiments, the etching process for forming the opening 148 may be a single etching step.

Referring to FIG. 2D, after the opening 148 is formed, a pair of contacts 112 are formed on the sidewalls of the opening 134. Each contact 112 includes a second conductive portion 114', a lining layer 116', a silicide layer 138' and a first conductive portion 136'. It should be noted that when the void 144 is present (FIG. 2C), the etching process described above further etches the portion of the second conductive material layer 114 adjacent to the void 144 resulting in enlarging the void 144, which in turn results in additional loss of the second conductive material layer 114.

Figure 2E:
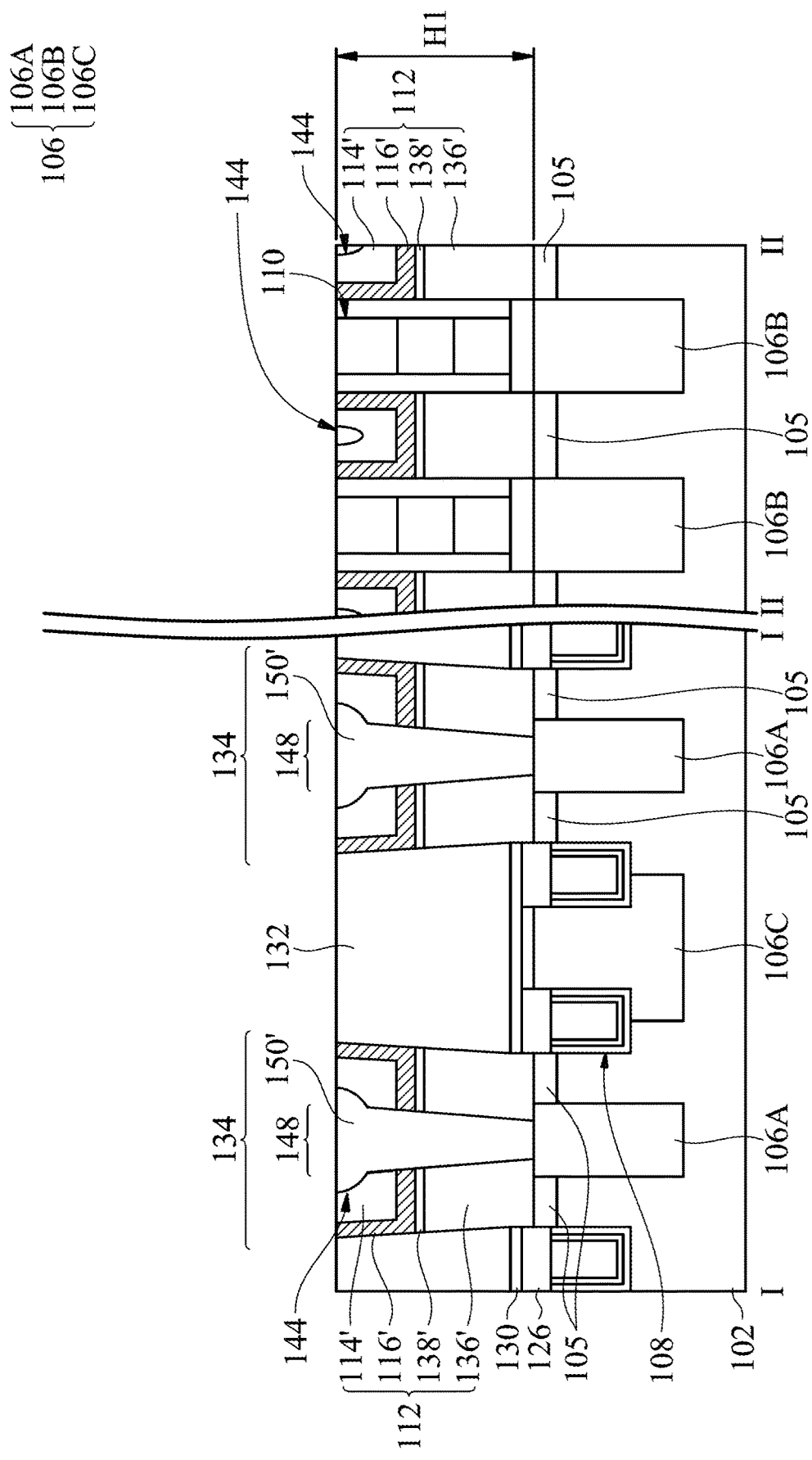
Figure 2E:
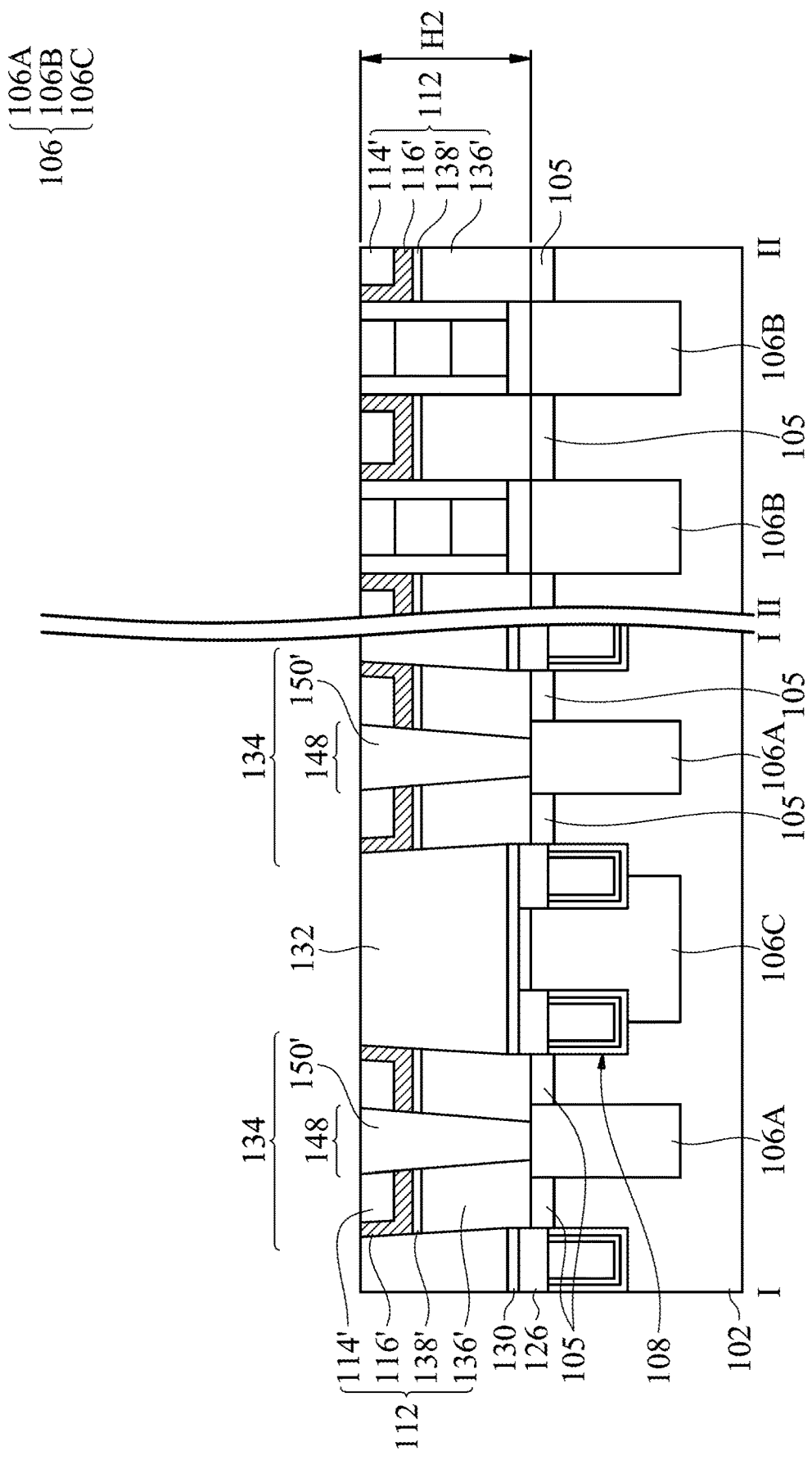

Referring to FIG. 2E, a dielectric layer 150 (not shown) is then blanket formed over the substrate 102, and a planarization process is performed on the dielectric layer 150, the dielectric layer 132, the second conductive portion 114' and the lining layer 116'. In an embodiment of the present disclosure, the planarization may be performed by using the mask layer 110C as a stop layer. As illustrated, after the planarization, top surfaces of the second conductive portion 114' and the lining layer 116' of the contact 112 are exposed. A top surface of a remaining portion 150' (subsequently referred to as a dielectric portion 150') of the dielectric layer 150 in the opening 148, the top surface of the dielectric layer 132, the top surface of the second conductive portion 114' and the top surface of the lining layer 116' are coplanar.

Referring to FIG. 2E', in an embodiment of the present disclosure, the planarization described above may also be performed until a portion of the dielectric layer 150 filling the enlarging void 144 is removed completely so as to increase the contact area between the contact 112 and the capacitor 154 (shown in FIG. 3) so that the contact resistance is reduced.

Figure 3:
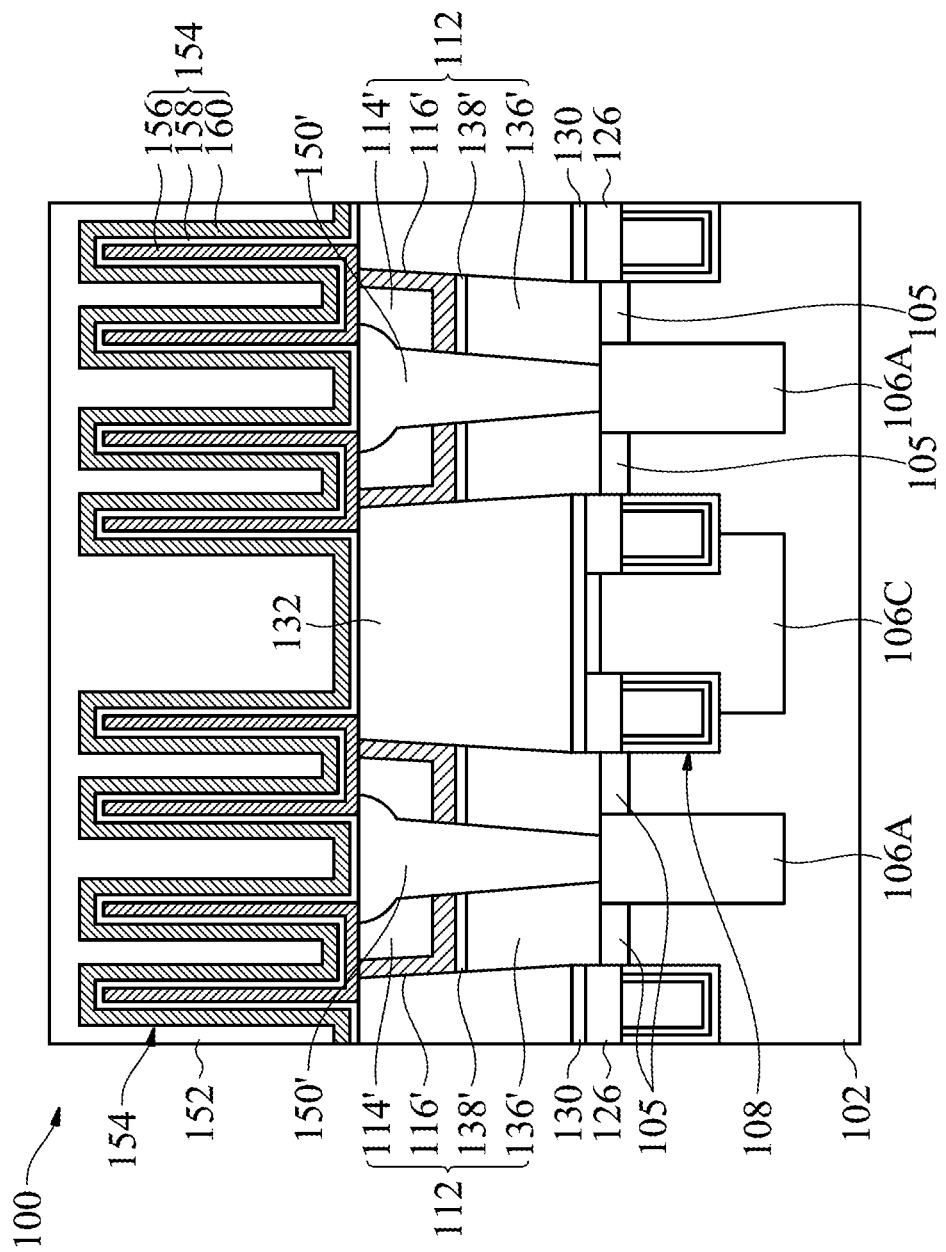
FIG. 3 is a cross-sectional view of the memory device in accordance with the first embodiment of the present disclosure.

Referring to FIG. 3, a capacitor 154 is formed over the contacts 112 and a dielectric layer 152 is formed over the capacitor 154 so that a memory device 100 is formed. The material of the dielectric layer 154 may be silicon oxide, silicon nitride, silicon oxynitride, or the like, and the dielectric layer 154 may be formed by a deposition process. In some embodiments, a contact pad (not shown) which configures to enlarge the landing area of the capacitor 154 may be formed between the capacitor 154 and the contact 112. The capacitor 154 includes a lower electrode layer 156, a dielectric layer 158 and an upper electrode layer 160. The lower electrode layer 156 of the capacitor 154 is in electric connection with the substrate 102 through the contacts 112. The material of the lower electrode layer 156 and the upper electrode layer 160 may be a metal material, such as titanium (Ti), tantalum (Ta), titanium nitride (TiN) or tantalum nitride (TaN). The material of the dielectric layer 158 may be a high-k dielectric material, such as Zirconia ($Zr_2O_3$) or Alumina ($Al_2O_3$).

Figure 4A:
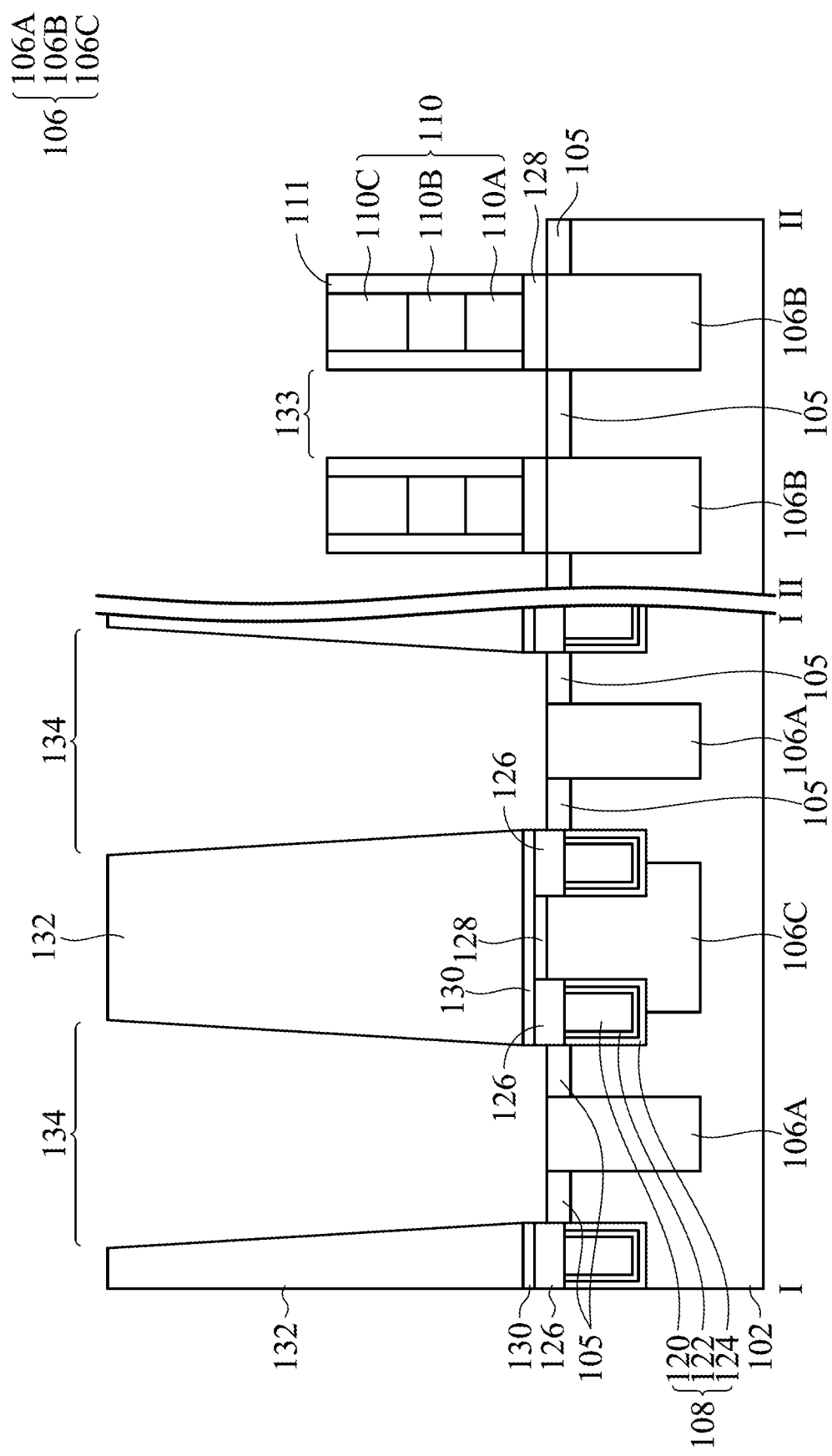
FIGS. 4A-4H and 4H' illustrate cross-sectional views at various stages of forming a memory device in accordance with a second embodiment of the present disclosure.
Figure 4B:
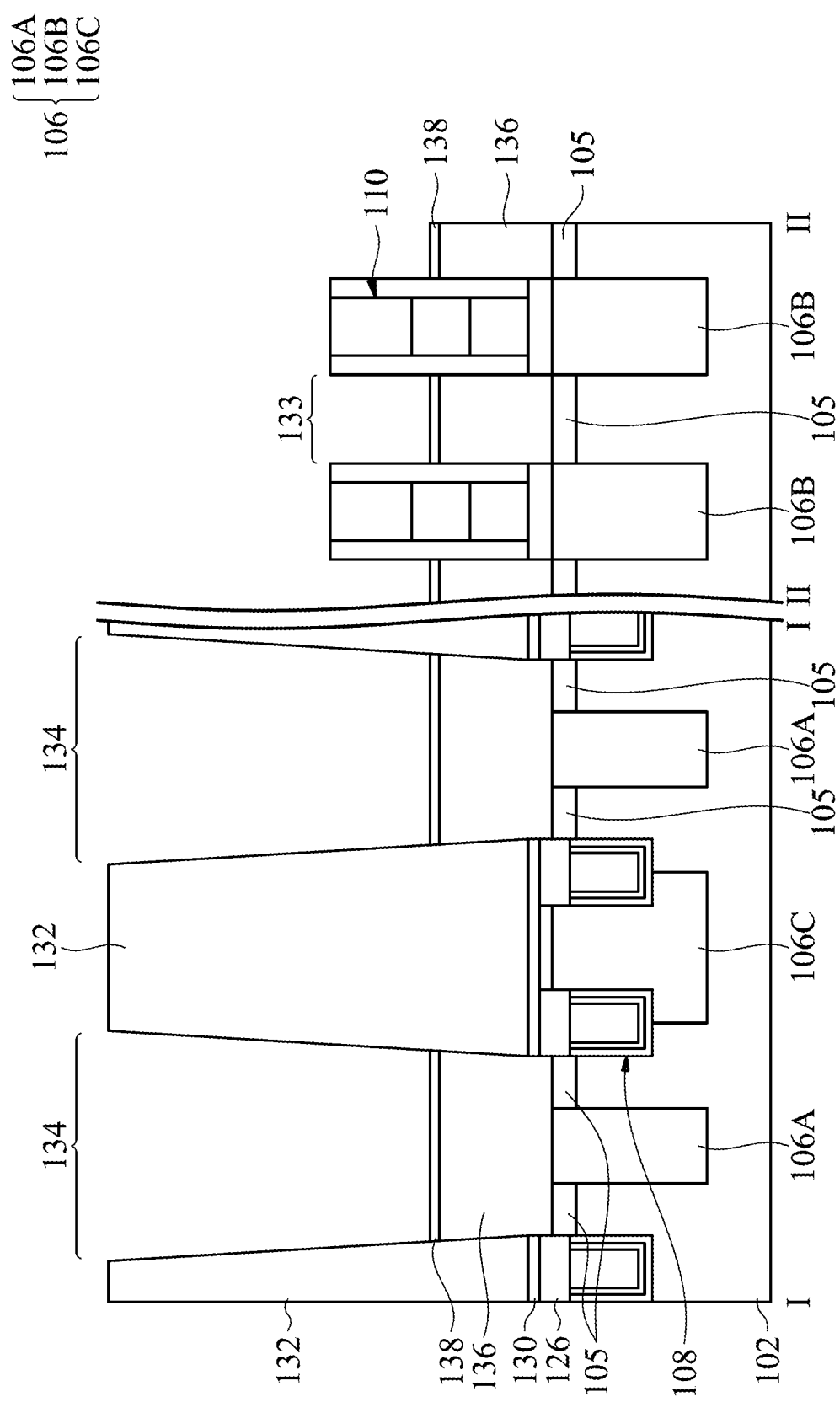

Referring to FIGS. 1, 4A-4H, 4H' and 5, the second embodiment is described below, wherein process steps illustrated in FIGS. 4A and 4B are same as those illustrated in FIGS. 2A and 2B and are not repeated here. In addition, for simplicity, the elements in the second embodiment which are similar to those in the first embodiment are dictated by the same reference numerals and may be formed by the similar materials and methods, unless otherwise described.

Figure 4C:
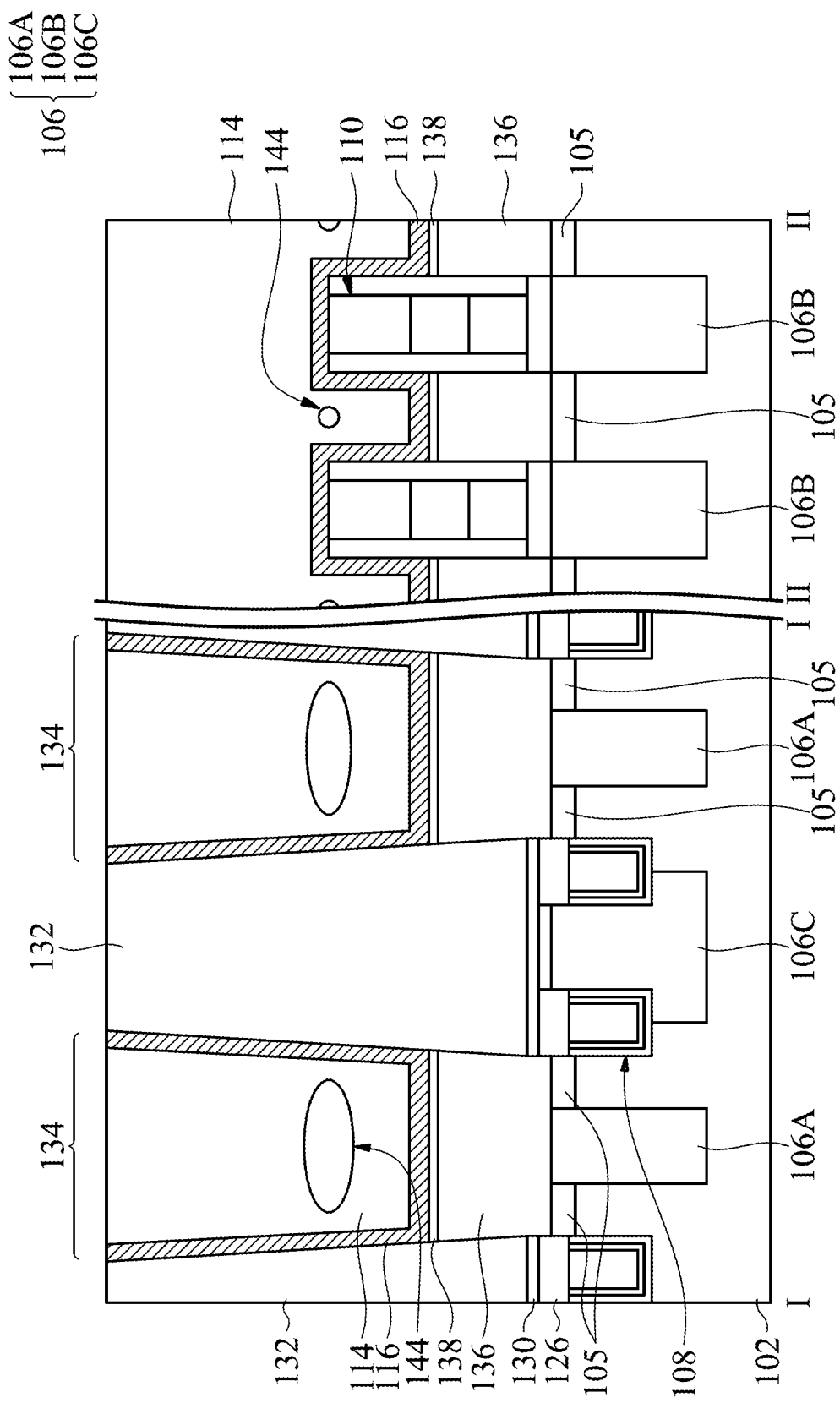

Continuing from FIG. 4B, as shown in FIG. 4C, the lining layer 116 is formed on the sidewalls of the upper portion of the opening 134 and the top surface of the first conductive material layer 136, and then the second conductive material layer 114 is formed to fill the upper portion of the opening 134. Specifically, the lining layer 116 is conformally formed on the substrate 102, and then the second conductive material layer 114 is blanket formed on the lining layer 116, and then a planarization process is performed to form the lining layer 116 and the second conductive material layer 114 in the upper portion of the opening 134. It is also worth noting that the void 144 may be formed within the second conductive material layer 114 as scaling down the size of the memory device.

Figure 4D:
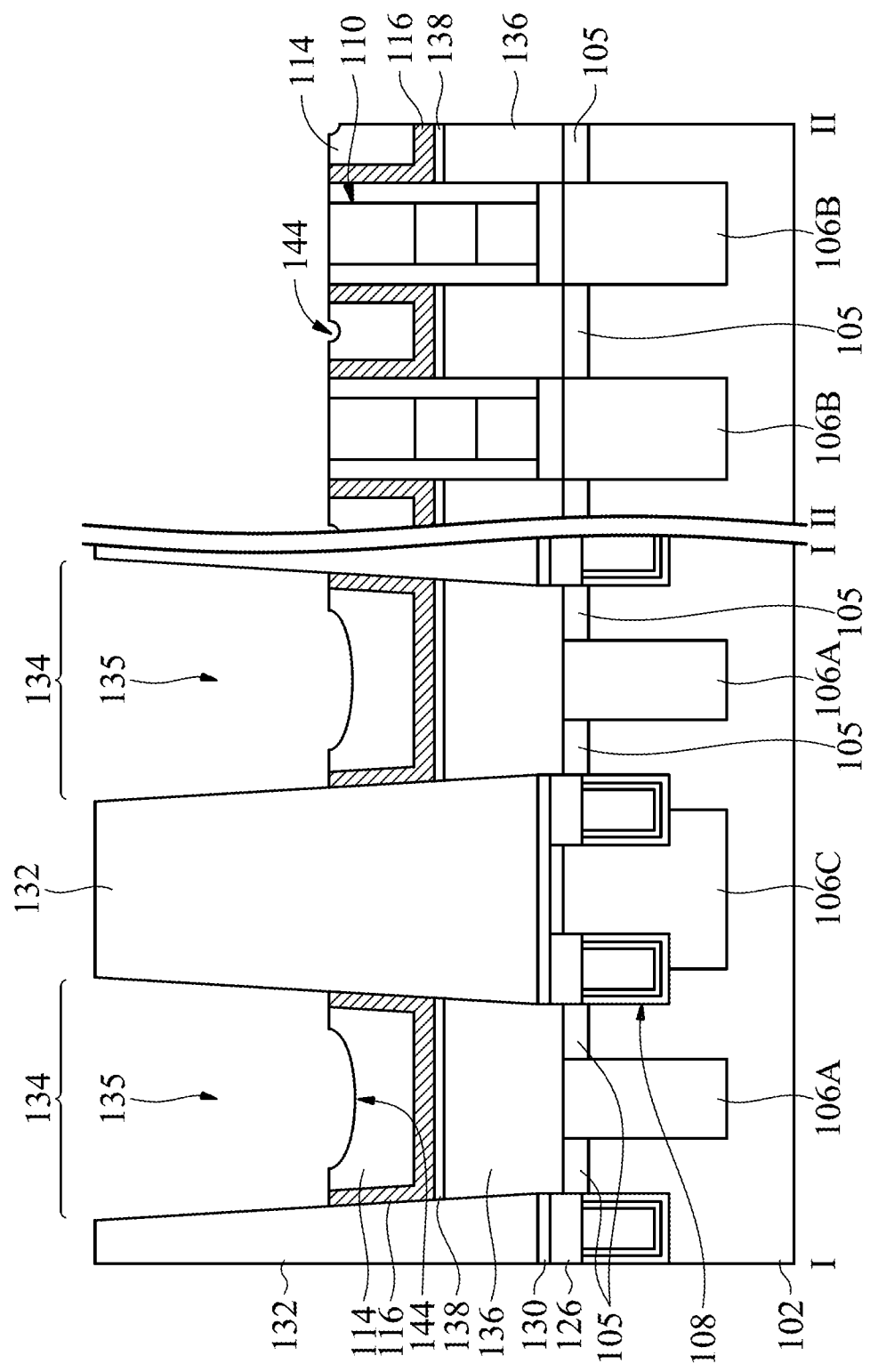

Referring to FIG. 4D, an etch-back process is performed on the second conductive material layer 114 and the lining layer 116 in the upper portion of the opening 134 to form the recess 135. In some embodiments, the mask layer 110C may act as a stop layer for removing portions of the second conductive material layer 114 and lining layer 116. In some other embodiments, the present disclosure may set the etch-back stop point depending on the desired height of the contact 112. As shown in FIG. 4D, after the etch-back process, the void 144 in the second conductive material layer 114 is exposed.

Figure 4E:
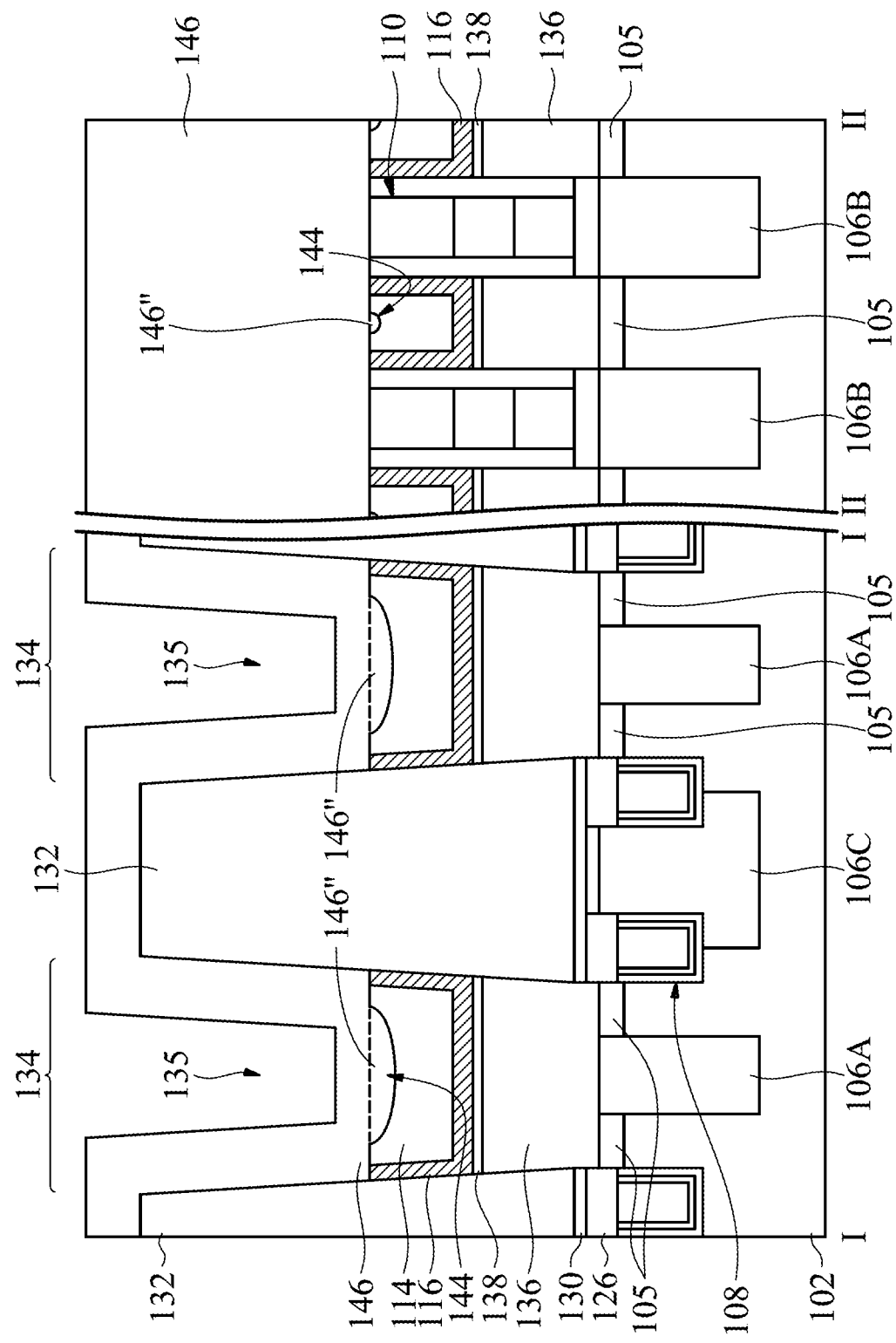

Referring to FIG. 4E, a protection layer 146 is conformally formed on the substrate 102. The protection layer 146 has horizontal portions on a bottom portion of the recess 135 and the top surface of the dielectric layer 132 and vertical portions on sidewalls of the recess 135, and the protection layer 146 does not entirely fill the recess 135. The material of the protection layer 146 may be silicon oxide, silicon nitride, silicon oxynitride, a combination thereof, or the like, and the protection layer 146 may be formed by a deposition process. In particular, when the void 144 is present, the protection layer 146 fills and covers the void 144 exposed from the second conductive material layer 114 (in the following description, the portion of protection layer 146 which fills the void 144 is referred to as protection portion 146").

Figure 4F:
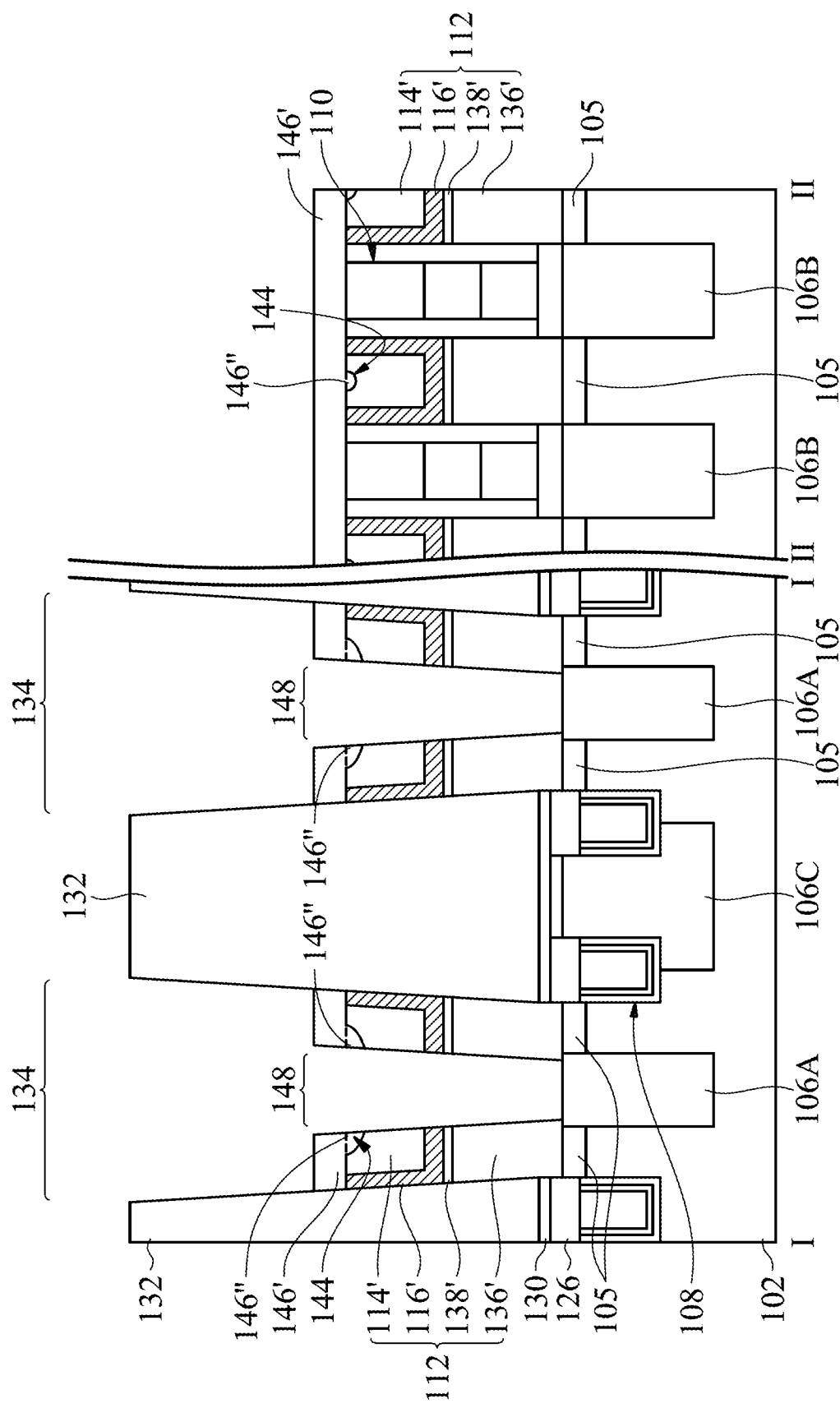

Next, an etching process is performed to form the opening 148 shown in FIG. 4F. In some embodiments, the etching process for forming the opening 148 may first remove the horizontal portion of the protection layer 146, and then remove portions of the second conductive material layer 114, the lining layer 116, the silicide layer 138 and the first conductive material layer 136 which are not covered by the vertical portion of the protection layer 146 by using the vertical portion of the protection layer 146 as an etching mask. The opening 148 penetrates through the protection layer 146, the second conductive material layer 114, the lining layer 116, the silicide layer 138 and the first conductive material layer 136 until the top surface of the isolation region 106A is exposed. In some embodiments, the etching process for forming the opening 148 may be multiple etching steps that use different etching formula for respective material layers. In some other embodiments, the etching process for forming the opening 148 may be a single etching step.

As shown in FIG. 4F, after forming the opening 148, a pair of contacts 112 and a remaining portion 146" (protection portion 146") of the protection layer 146' are formed on the sidewalls of the opening 134. Each contact 112 includes a second conductive portion 114', a lining layer 116', a silicide layer 138' and a first conductive portion 136'. In particular, in the present disclosure, when the void 144 is present, the protection layer 146 fills and covers the void 144 (shown in FIG. 4E) so that thus the protection portion 146" protects the portion of the second conductive material layer 114 adjacent to the void 144 (shown in FIG. 4F) during the etching process for forming the opening 148. Therefore, it is possible to prevent the second conductive material layer 114 from further loss due to the etching process.

Figure 4G:
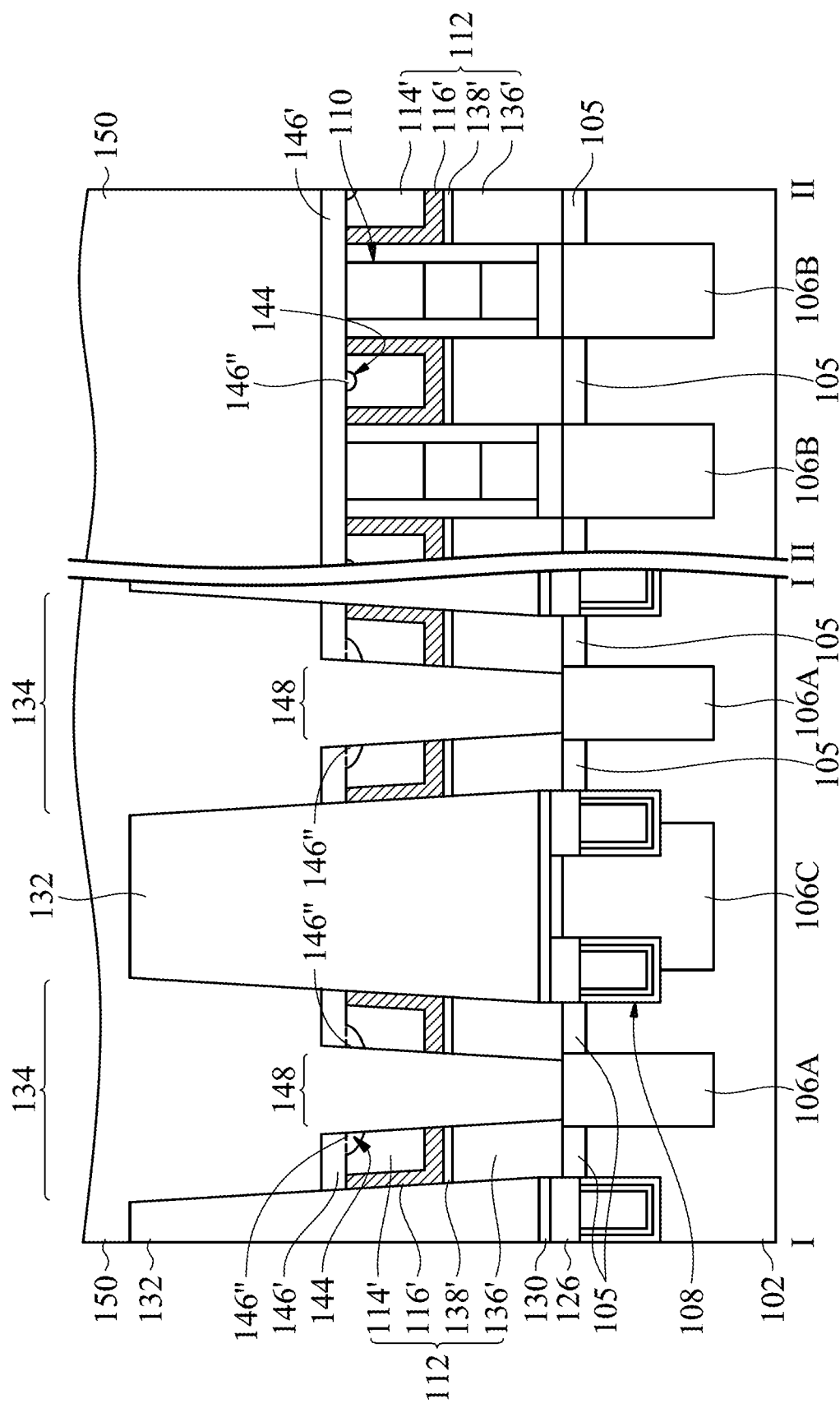

Referring to FIG. 4G, the dielectric layer 150 is blanket formed over the substrate 102. The dielectric layer 150 fills the openings 148 and 134 and covers the dielectric layer 132. The material of the dielectric layer 150 may be silicon oxide, silicon nitride, silicon oxynitride, a combination thereof, or the like. In some embodiments, the material of the dielectric layer 150 may be different from that of the protection layer 146.

Figure 4H:
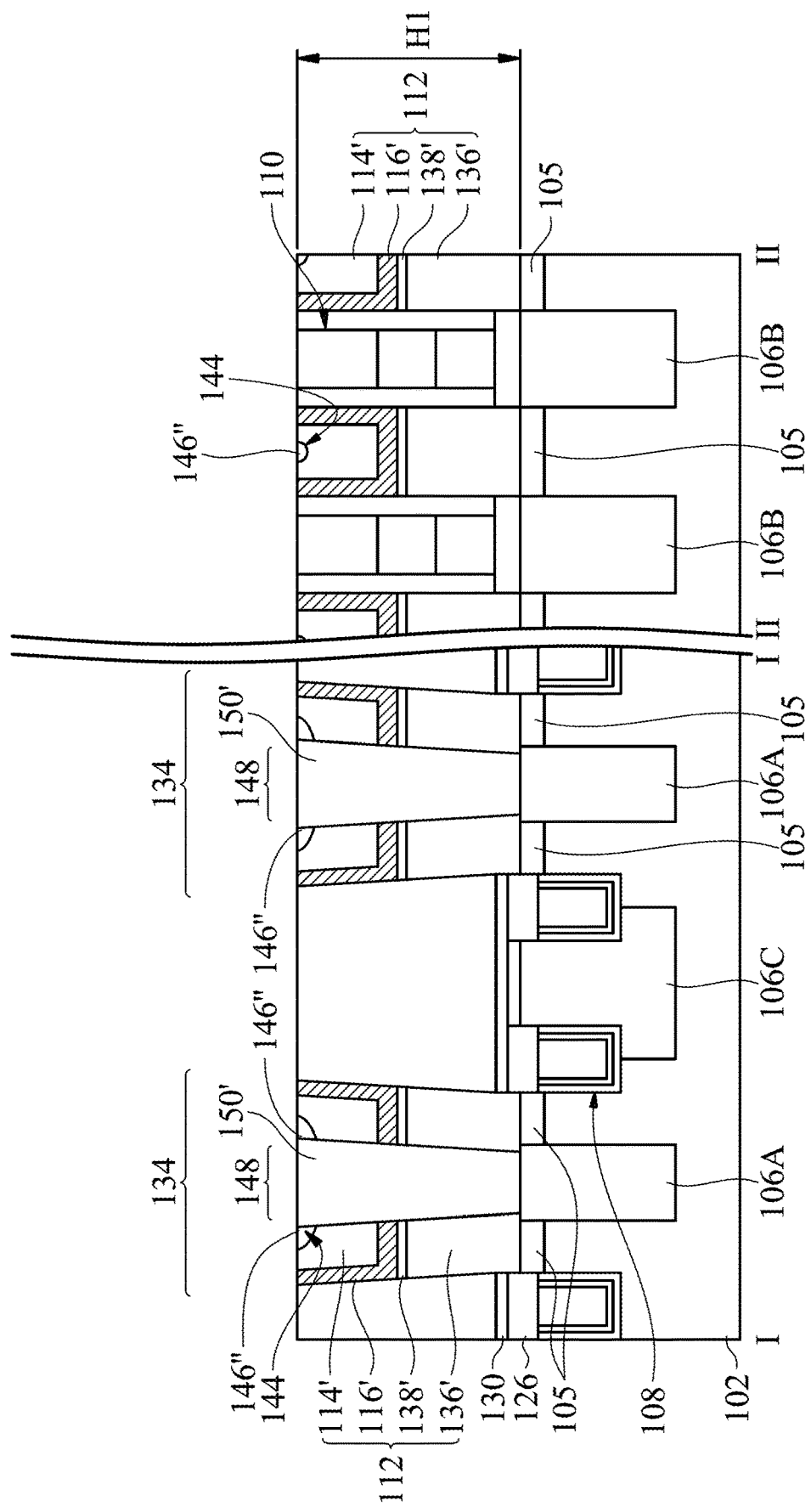
Figure 4H:
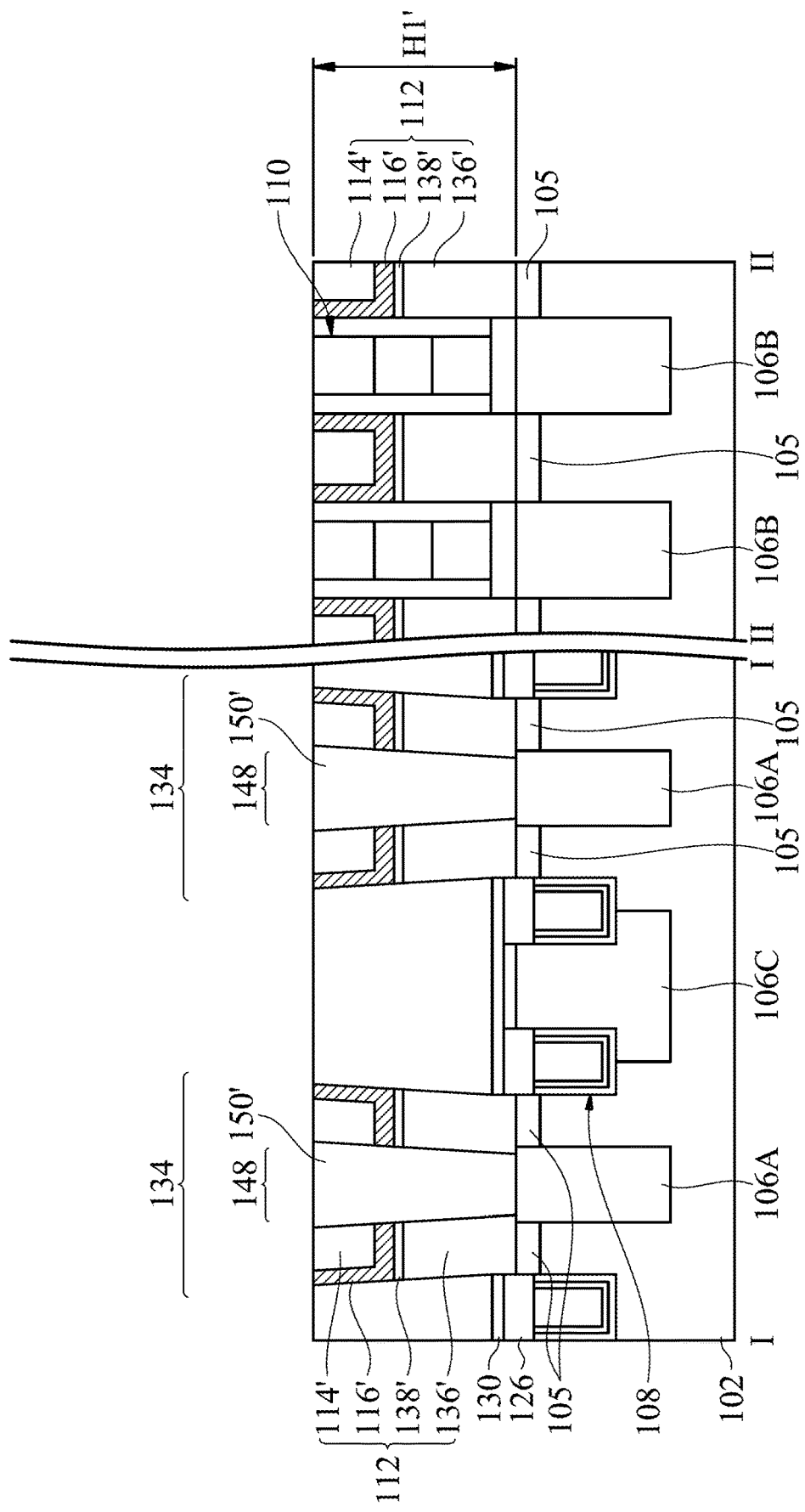

Referring to FIG. 4H, a planarization process is then performed on the dielectric layer 150, the remaining portion of protection layer 146' and dielectric layer 132. In some embodiment, the planarization process may be performed by using the mask layer 110C as a stop layer. As illustrated, after the planarization, the second conductive portion 114' of the contact 112 is exposed. A top surface of the dielectric layer 132, a top surface of the lining layer 116', a top surface of the second conductive portion 114', a top surface of the protection portion 146" and a top surface of the remaining portion 150' (dielectric portion 150') of the dielectric layer 150 in the opening 148 are coplanar. The pair of the contacts 112 are separated from each other by the dielectric portion 150'. In particular, in the present disclosure, after the planarization, the protection portion 146" is left on a corner of the second conductive portion 114' in connection with a side wall of the second conductive portion 114', which is in contact with the dielectric portion 150', and the top surface of the second conductive portion 114'.

Still referring to FIG. 4H, alternatively, a blanket etch is performed on the dielectric layer 150, the remaining portion of protection layer 146' and dielectric layer 132 to expose the second conductive portion 114' of the contact 112. The top surface of the dielectric layer 132, the top surface of the lining layer 116', the top surface of the second conductive portion 114', the top surface of the protection portion 146" and the top surface of the dielectric portion 150' are coplanar in some other embodiments of the present disclosure.

Referring to FIGS. 2E and 4H, since the protection portion 146" protects the portion of the second conductive material layer 114 adjacent to the void in the second embodiment, the second conductive portion 114' of the contact 112 in the second embodiment has a greater top surface than that in the first embodiment, which further reduces the resistance between the contact 112 and the capacitor 154.

In some other embodiments, the planarization process may also be performed until the protection portion 146" is completely remove to further increase the area of the top surface of the second conductive portion 114', as shown in FIG. 4H'. In this embodiment, since no enlargement of the void 144 has occurred in the second embodiment, the protection portion 146" may be removed by removing a small amount of the second conductive portion 114' and the lining layer 116' so that the contact 112 may substantially remain a height H1' equal to the original the height H1. However, in the first embodiment, the void 144 may be removed by removing a large amount of the second conductive portion 114' and the lining layer 116' so that the height of the contact 112 is decreased into height H2, as shown in FIG. 2E'. Therefore, the second embodiment of the present disclosure can maintain contact 112 at the height H1' which is substantially equal to the desired height H1, which ensures the device quality.

Referring to FIG. 5 which is similar to FIG. 3, the capacitor 154 is formed on the contact 112 and a dielectric layer 152 is formed on the capacitor 154 so as to form the memory device 100. The material and formation method of the capacitor 154 and the dielectric layer 152 are similar to those described in FIG. 3 and does not repeat herein.

In addition, it should be noted that, in the first embodiment of the present disclosure, since the second conductive material layer 114 acts as an etching mask for forming the contact 112, the second conductive portion 114' of the contact 112 may be affected by the etching process so that the quality of the resulting device is reduced. Furthermore, during conformally forming the second conductive material layer 114, it is not easy for the metal material of the second conductive material layer 114 to uniformly form on the sidewalls of the opening 134 to have the same thickness on the sidewalls so that the width of the contact 112 varies. However, in the second embodiment of the present disclosure, since the protection layer 146, which is easily deposited uniform, additionally formed as the etching mask for forming the contact 112, it is possible to accurately control the height and width of the desired contact 112, and thus ensure the quality of the resulting device.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a substrate;
   an isolation region and active regions disposed in the substrate;
   pairs of word lines disposed in the substrate, wherein each of the active regions corresponds to one of the pairs of word lines, and each of the active regions has a drain region between one word line of the pairs of word lines and the isolation region and a source region between one of the pairs of word lines;
   a first dielectric layer disposed on the substrate and covering the pairs of word lines, wherein the first dielectric layer has an opening exposing the isolation region and drain regions of neighboring two of the active regions; and
   a pair of contacts and a dielectric portion disposed in the opening,
   wherein the pair of contacts are separated from each other by the dielectric portion,
   wherein each of the pair of contacts comprises a first conductive portion disposed on the substrate, a second conductive portion disposed over the first conductive portion and a lining layer disposed between the first conductive portion and the second conductive portion and on a sidewall of the opening,
   wherein the second conductive portion has a sidewall that is in contact with the dielectric portion and the lining layer is not located thereon, and
   wherein the second conductive portion has a corner in connection with the sidewall and a top surface of the second conductive portion, and a protection portion is disposed on the corner.

2. The memory device as claimed in claim 1, further comprising a capacitor disposed on the pair of contacts, wherein the capacitor comprises a lower electrode layer, an upper electrode layer and a dielectric layer disposed therebetween, and the lower electrode layer is in connection with the substrate through the pair of contacts.

3. The memory device as claimed in claim 1, wherein the pair of contacts are correspondingly disposed on the drain regions of neighboring two of the active regions.

4. The memory device as claimed in claim 1, wherein each of the pair of contacts further comprises a silicide layer disposed between the first conductive portion and the lining layer.

5. The memory device as claimed in claim 1, wherein a top surface of the dielectric layer, a top surface of the lining layer, the top surface of the second conductive portion and the top surface of the protection portion are coplanar.

* * * * *